United States Patent [19]

Imaeda et al.

[11] Patent Number: 5,122,830
[45] Date of Patent: Jun. 16, 1992

[54] IMAGE RECORDING APPARATUS HAVING FRONT/REAR SHEET FACE SENSOR

[75] Inventors: Kanae Imaeda, Komaki; Satoru Kuwabara, Chiryu; Yuji Asano, Nagoya; Hisanori Okamoto, Owariasahi; Masatoshi Yoshiyama, Nagoya; Tsuyoshi Kushida, Nagoya; Yukichi Sawaki, Nagoya; Shin Asai; Masanari Kobayashi, both of Ichinomiya, all of Japan

[73] Assignee: Brother Kogyo Kabushiki Kaisha, Aichi, Japan

[21] Appl. No.: 692,912

[22] Filed: Apr. 29, 1991

[30] Foreign Application Priority Data

| Apr. 27, 1990 | [JP] | Japan | 2-45229[U] |
| May 10, 1990 | [JP] | Japan | 2-120840 |
| May 15, 1990 | [JP] | Japan | 2-126097 |
| May 15, 1990 | [JP] | Japan | 2-126099 |
| May 15, 1990 | [JP] | Japan | 2-126100 |
| May 17, 1990 | [JP] | Japan | 2-51339[U] |
| May 17, 1990 | [JP] | Japan | 2-127867 |
| May 18, 1990 | [JP] | Japan | 2-52563[U] |

[51] Int. Cl.$^5$ .............................. G03B 27/52
[52] U.S. Cl. .................... 355/27; 355/132; 355/68
[58] Field of Search .......... 355/27, 83, 77, 68, 355/132; 356/434; 250/559, 571, 574

[56] References Cited

U.S. PATENT DOCUMENTS

| 4,825,257 | 4/1984 | Yoshino et al. | 355/132 |
| 4,830,501 | 5/1989 | Terashita | 355/204 |

Primary Examiner—Hix. L. T.
Assistant Examiner—D. Rutledge
Attorney, Agent, or Firm—Kane, Dalsimer, Sullivan, Kurucz, Levy, Eisele and Richard

[57] ABSTRACT

An image recording apparatus which records an image of an original document on an image receiving sheet with the use of a photosensitive recording medium, the image receiving sheet having front and rear faces differing in reflection ratio. To detect error in sheet face orientation, a sheet face sensor unit is provided upstream of a pressure developing unit which discriminates a face of the image receiving sheet. The sensor unit includes a light emitting element for emitting light toward the face of the image receiving sheet and a light receiving element for receiving light emitted from the light emitting element and reflected on the face of the image receiving sheet. A central processing unit is supplied with data representative of amounts of light emitted from the light emitting element and light received at the light receiving element, wherein the central processing unit computes a reflection ratio based on the data supplied thereto and produces a discrimination signal indicative of an error in sheet face orientation of the image receiving sheet based on the reflection ratio being computed.

10 Claims, 8 Drawing Sheets

IMAGE RECORDING APPARATUS HAVING FRONT/REAR SHEET FACE SENSOR

BACKGROUND OF THE INVENTION

The present invention relates generally to image recording apparatuses, and more particularly to an image recording apparatus having a front/rear sheet face sensor wherein a recording sheet being fed in upside down is detected by the sensor and the image recording processing is thereby controlled.

Heretofore, various types of image recording apparatuses have been developed and used. One uses a photosensitive pressure-sensitive recording medium and an image receiving sheet. The photosensitive pressure-sensitive recoring medium has a surface coated with an immense number of microcapsules encapsulating a chromogenic material therein. The developer sheet has a surface coated with a developer material which reacts with the chromogenic material. To perfrom image recordation, the photosensitive pressure-sensitive recording medium (hereinafter referred to as "microcapsule sheet") is exposed to an imaging light to selectively photocure the microcapsules to thus form a latent image thereon. The exposed microcapsule sheet is brought to facial contact with the developer sheet and a pressure is applied thereto, with the result that the microcapsules which remain uncured are ruptured and the chromogenic materials released therefrom react with the developer material to thus form a visible output image on the developer sheet.

In the image recording apparatus of the type described above, it is necessary that the developer material coated surface be brought into facial contact with the latent image formed surface of the microcapsule sheet. Nevertheless, the conventional image recording apparatuses are not provided with means for identifying the face of the developer sheet. Even if the developer sheet is erroneously fed upside down, a series of image processing are performed as is done normally, resulting in that no visible image is produced and a paper jam sometimes occurs.

SUMMARY OF THE INVENTION

The present invention has been made to obviate the above-described drawbacks and accordingly it is a primary object of the present invention to provide an image recording apparatus having a sheet face sensing unit which can identify the front or rear surface of the sheet with high accuracy.

It is another object of the present invention is to provide such a sheet face sensing unit which does not scratch or damage the sheet.

It is still another object of the present invention to provide an image recording apparatus which when an error in the sheet face orientation is detected, allows to carry out subsequent image forming processing without interruption.

In accordance with the present invention, there is provided an image recording apparatus for recording an image of an original document on an image receiving sheet with the use of a photosensitive recording medium, the image receiving sheet having front and rear faces differing in reflection ratio, the apparatus comprising exposure means for exposing a photosensitive recording medium with an imaging light to form a latent image thereon, conveying means for conveying the image receiving sheet normally at a given speed, discrimination means for discriminating a face of the image receiving sheet, said discrimination means comprising a light emitting element for emitting light toward the face of the image receiving sheet, a light receiving element for receiving light emitted from said light emitting element and reflected on the face of the image receiving sheet, and a control unit supplied with data representative of amounts of light emitted from said light emitting element and light received at said light receiving element, wherein said control unit computes a reflection ratio based on the data supplied thereto and outputs a discrimination signal indicative of one of the front and rear faces of the image receiving sheet, and wherein said control unit controls said conveying means so that the image receiving sheet is either temporarily stopped or conveyed at a speed lower than the given speed when said light receiving element receives the light reflected on the face of the image receiving sheet.

In operation, the light from the light emitting element is applied onto the image receiving sheet and the light reflected thereon is received at the light receiving element. During this optical detection of the face of the image receiving sheet, the conveying speed of the image receiving sheet is zerozed or reduced to a lower level than the given speed, so that the light received at the light receiving element exactly corresponds to the state of the sheet face to be detected. The control unit can therefore exactly computes the reflection ratio and thus discriminate the sheet face.

The above and other objects, features and advantages of the present invention will become more apparent from the following description when taken in conjunction with the accompanying drawings in which preferred embodiments of the present invention are shown byh way of illustrative examples.

DETAILED DESCRIPTION OF THE PREFERRED EMBODIMENT

A basic construction of an image recording apparatus to which the present invention is applied will be described with reference to FIG. 1.

Figure 1:
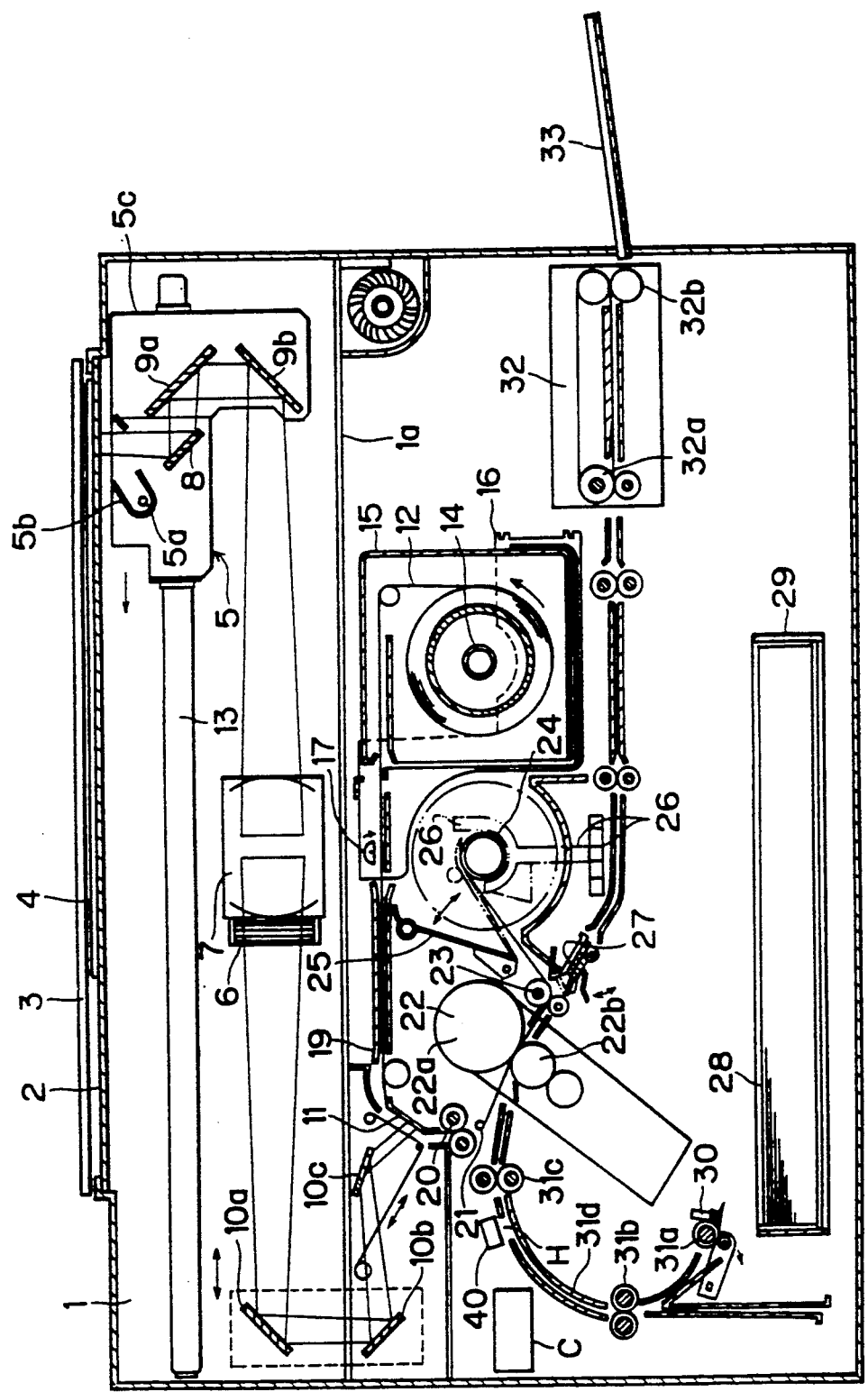
FIG. 1 is a vertical cross-sectional view showing an image recoring apparatus according to the present invention.

FIG. 1 shows an overall structure of the image recording apparatus 1 which generally employs an elongated, web-like photosensitive pressure-sensitive image recording sheet (hereinafter referred to as "microcapsule sheet") 12 and a cut form image receiving sheet (hereinafter referred to as "developer sheet") 28. The microcapsule sheet 12 has a substrate whose surface is coated with immense number of microcapsules encapsulating therein chromogenic materials reactable with a developer material coated over a substrate of the developer sheet 28. By this reaction, an output color image is provided on the developer sheet 28. Details of these image recording media are disclosed in U.S. Pat. No. 4,399,209, and therefore, further description thereof is omitted herein.

At a top portion of the image recording apparatus 1, a transparent original support glass 2 for mounting thereon an original document 4 is provided, and a support glass cover 3 is pivotally disposed over the original support glass 2. Between the support glass 2 and the cover 3, the original document 4 is positioned with its imaging surface face down.

An optical system is provided below the original support glass 2. The optical system includes a light source 5 including a halogen lamp 5a, reflectors 5b, and a reflection mirror 8, and a frame member 5c is provided for housing therein light source unit 5. The frame member 5c is formed with a slit (not shown) for allowing light to pass therethrough toward the original support glass 2. A shaft 13 extends in parallel with the original support glass 2, and the frame member 5c is reciprocally movable along the shaft 13. The light source 5 provides a line light toward the original support glass 2 in a direction perpendicular to the moving direction of the frame member 5c. The light passing through the original support glass 2 is reflected from the original document 4 and is directed downwardly.

The optical system includes a first pair of reflection mirrors 9a, 9b supported by the frame member 5c but movable independently of the light source 5, another pair of reflection mirrors 10a, 10b, a projection lens 7, a filter unit 6 and a final reflection mirror 10c. The lens 7 and the filter unit 6 are positioned between the first and second pairs of the reflection mirrors 9a, 9b and 10a, 10b. The filter unit 6 controls color tone of an output image. The light reflected from the original document 4 is reflected upon the reflection mirror 8 and the first pair of reflection mirrors 9a, 9b, so that the light is directed toward the second pair of the reflection mirrors 10a, 10b through the lens 7 and the filter 6 in a direction in parallel to the moving direction of the light source 5.

An exposure stand 11 is provided at a position adjacent the second pair of the reflection mirrors 10a, 10b for exposing the microcapsule sheet 12 to imaging light. For this, the final reflection mirror 10c is provided between the reflection mirror 10b and the exposure stand 11 for directing the light reflected from the second pair of the reflection mirrors 10a, 10b toward the exposure stand 11. Accordingly, a latent image corresponding to the image of the original document 4 is formed on the microcapsule sheet 12 positioned on the exposure stand 11.

The second pair of the reflection mirrors 10a, 10b are normally stationarily positioned. However, these mirrors are movable together in the axial direction of the shaft 13 so as to control an optical path length in accordance with the change in copying magnification (m) such as size enlargement or reduction. Further, provided that a feeding velocity of the microcapsule sheet 12 is represented by "V", and the copying magnification is represented by "m", the moving speed of the halogen lamp 5a and the mirror 8 is set to V/m, and the moving speed of the first pair of reflection mirrors 9a and 9b is set to V/2m in order to obtain the latent image on the microcapsule sheet 12 positioned on the exposure stand 11 with the desired magnification m.

The elongated microcapsule sheet 12 is of a rolled form and a leading end portion of the sheet 12 is provided with a leader tape portion (not shown). More specifically, at a center portion of the copying apparatus 1, a magazine 16 is disposed, and a sheet cartridge 15 is detachably positioned in the magazine 16. In the sheet cartridge 15, a rolled microcapsule sheet 12 is wound over a cartridge shaft 14. Within the magazine 16, a sector roller 17 is provided for introducing the leader tape portion of the microcapsule sheet 12 into a predetermined position of the sheet path so as to direct the leader portion toward the exposure stand 11.

Further, a feed roller 19 is rotatably provided at a position downstream of the sector roller 17 and below the exposure stand 11, and another feed rollers 20, 20 are rotatably provided at a position downstream of the feed roller 19. One of the feed rollers 20 is movable toward and away from the remaining feed roller 20. Between the feed rollers 19 and 20, the exposure stand 11 is provided. Moreover, a dancer roller or a tension control roller 21 is provided for controlling a sheet slack of the microcapsule sheet, and a separation roller 23 is rotatably provided for separating the microcapsule sheet 12 from the developer sheet 28.

A pressure developing unit 22 having a large diameter pressure roller 22a, a small diameter pressure roller 22b and a back-up roller 22c is positioned between the dancer roller 21 and the separation roller 23 for pressure developing operation. A takeup shaft 24 is provided for taking up the light exposed microcapsule sheet 12. Thus, the microcapsule sheet path is defined by, in order, the feed sector roller 17, the feed roller 19, an upper surface of the exposure stand 11, the feed rollers 20, the dancer roller 21, the pressure developing unit 22, the separation roller 23 and the takeup shaft 24. Incidentally, a partitioning wall 1a is provided so as to prevent the microcapsule sheet 12 positioned at upstream of the exposure stand 11 from being irradiated with light.

The feeding velocity of the microcapsule sheet 12 is controlled at constant speed, and the feeding movement is in synchronism with the movements of the mirrors 8, 9a and 9b. Accordingly, a latent image in line-by-line basis is successively provided on the microcapsule sheet 12 when it passes through the exposure stand 11.

An automatic sheet loading function is given in the image recording apparatus. By the automatic loading function, the leader tape portion of the rolled microcapsule sheet 12 can be automatically directed along the sheet path and is wound over the takeup shaft 24. Therefore, the subsequent microcapsule sheet 12 can be automatically installed at the sheet path. For this automatic loading, the above described sector roller 17 provided in the magazine 16 will initiate the pulling out operation of the leader portion of the microcapsule sheet 12. Further, a separation chute 27 is pivotably provided at a position downstream of the separation roller 23 so as to direct the leader portion toward the takeup shaft 24. Furthermore, an upper guide 25 and a lower guide 26 are provided immediately above and below the takeup shaft 24, respectively for guiding the winding of the leader portion over the takeup shaft 24.

The lower guide 26 is pivotally provided and movable between a solid line position and a dotted line position. Further, the upper guide 25 and the separation chute 27 are also pivotally movable in the directions indicated by respective arrows. For loading the microcapsule sheet at the sheet path, the upper guide 25, the lower guide 26 and the separation chute 27 are moved to positions indicated by a dotted chain lines in FIG. 1 for permitting the leader tape to be wound over the takeup shaft 24, On the other hand, when the loading operation is completed, these are moved to positions indicated by solid lines in FIG. 1, so that image recording operation is achievable.

At a position below the pressure developing unit 22, a sheet cassette 29 is installed in which a stack of the cut developer sheets 28 are stored. At a position above the cassette 29, a sheet feed mechanism 30 is provided which includes a suction means so as to deliver each one of the developer sheets 28 toward the pressure developing unit 22. Between the sheet feed mechanism 30 and the pressure developing unit 22, sheet feed rollers 31a, 31b, 31c and a sheet feed guide 31d are provided. The developer sheet 28 is thus delivered to an upstream side of the pressure developing unit 22.

Further, a thermal fixing unit 32 is provided at a position downstream of the separation chute 27. The thermal fixing unit 32 includes a heat roller 32a for heating the developer sheet 28, a discharge roller 32b and a transferring belt 32c mounted between the heat roller 32a and the discharge roller 32b. In the heat roller 32a, a heater 32d is provided for heating the heat roller 32a. A discharge tray 33 is provided at a position downstream of the thermal fixing unit for receiving the developer sheet 28 in which a visible output image is formed. Further, at a position above the thermal fixing unit 32, provided are a deodorization filter 37 for absorbing gaseous component released from the developer sheet 28 and generated at the thermal fixing operation and a fan 38 for directing gaseous odor toward the filter 37.

With this structure, if the sheet cartridge 15 is mounted on the magazine 16, the automatic sheet loading operation will be initiated. The feed sector roller 17 is rotated about its axis by at least once so as to pull out the leader tape portion from the cartridge 15 to the feed rollers 20, 20. Then, the rotation of the feed roller 17 is stopped whereas the feed rollers 20, 20 are driven to further feed the leader tape portion toward the pressure developing unit 22. In this case, the separation chute 27, the upper guide 25 and the lower guide 26 are moved to positions indicated by one dotted chain lines in FIG. 1, so that the leader tape portion can be directed to the takeup shaft 24 and is wound thereover. Upon completion of the automatic sheet loading, the upper guide 25, the lower guide 26 and the separation chute 27 are moved to their solid line positions shown in FIG. 1 for performing the image recording operation.

If a copy start key (not shown) is manipulated, the reflection mirror 8 and the halogen lamp 5a are moved at a speed V/m, and the first pair of reflection mirrors 9a, 9b are moved at a speed V/2m assuming that the microcapsule sheet 12 is fed at a speed of V with aiming at image magnification of m. Since the feeding speed of the microcapsule sheet 12 is synchronized with the moving speeds of the mirrors 8, 9a, 9b, a line latent image is successively formed on the microcapsule sheet 12 when it passes over the exposure stand 11. This moving sped ratio is provisionally set in accordance with the selected magnification m.

The microcapsule sheet 12 which carries the latent image is further transferred toward the pressure developing unit 22, and at the same time, the developer sheet 28 is fed thereto by the sheet feed mechanism 30 and the feed rollers 31a, 31b, 31c. The latent image surface of the microcapsule sheet 12 is superposed with the developer material surface of the developer sheet 28 at the pressure developing unit 22, and these are pressed together. Therefore, unexposed microcapsules are ruptured to provide a chromogenic reaction with the developer materials of the developer sheet 28, to thereby form a visible color image on the developer sheet 28.

The microcapsule sheet 12 passed through the pressure developing unit 22 is separated from the developer sheet 28 by the separation roller 23 and is fed toward the takeup shaft 24. On the other hand, the developer sheet 28 is fed to the thermal fixing unit 32 where the coloring of the visible image is promoted by the heat roller 32a. The thus treated developer sheet 28 is discharged out of the thermal fixing unit by the discharge roller 32b and is fed onto the discharge tray 33.

As described above, the pressure developing unit 22 generally includes the large diameter pressure roller 22a, the small diameter pressure roller 22b and a backup roller 22c. The large diameter pressure roller 22a is rotatably supported by a pair of side plates 1b and 1b, and an upper plate 1c is disposed on the side plates 1b and 1b. The small diameter pressure roller 22b is rotatably supported by another pair of side plates 1d and 1d supported by the plates 1b and 1b and movable within a limited range with respect to the side plates 1b and 1b. The small diameter pressure roller 22b is disposed movable toward and away from the large diameter pressure roller 22a.

In the upper portion of the apparatus 1, there is provided a panel (not shown) in which arranged are various kinds of operation keys and an error display lamp 140 for alerting the operator of a trouble occuring in the apparatus, such as paper jam.

A front/rear sheet face sensor unit according to the present invention will be described with reference to FIGS. 2 through 4.

As shown in FIG. 1, an opening H is formed on the sheet feed guide 31d wherein a front/rear sheet face sensor unit 40 is disposed. The sensor unit 40 may be provided immediately upstream of the pressure developing unit 22. The sensor unit 40 includes a light emitting element 41 and a light receiving element 42 to be described later with reference to FIG. 3. The developer sheet 28 passes beneath the sensor unit 40 and the light receiving element 42 receives light emitted from the light emitting element 41 and reflected from the developer sheet 28 passing beneath the sensor unit 40.

Figure 2:
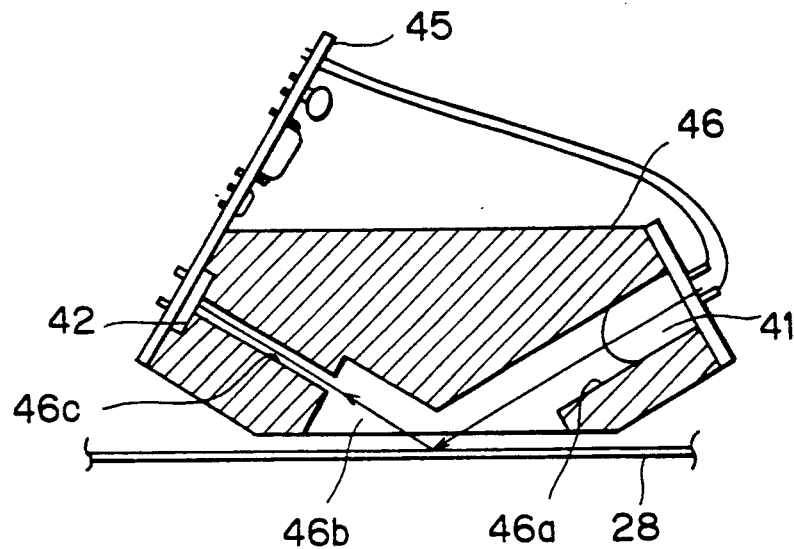
FIG. 2 is a vertical cross-sectional view showing a sheet face sensing unit according to the present invention.
Figure 3:
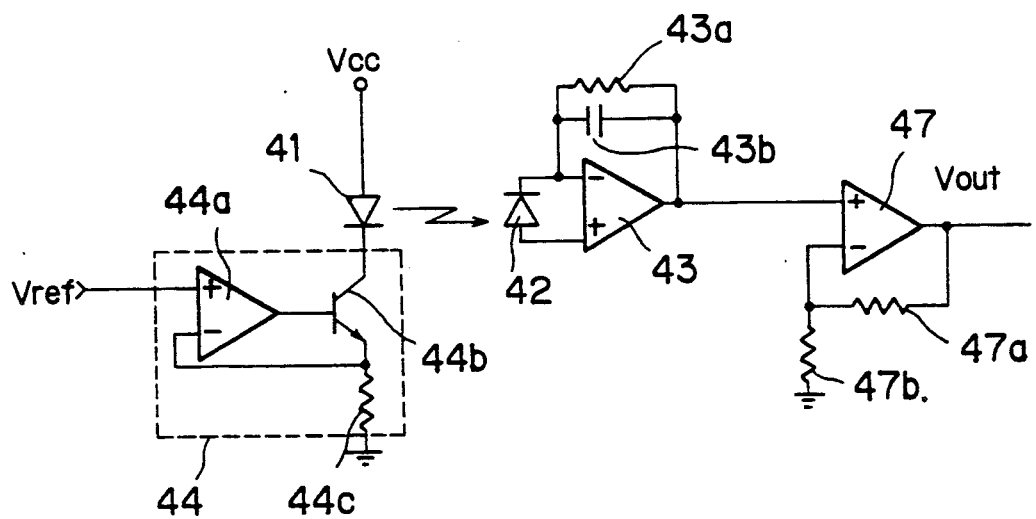
FIG. 3 is a circuit diagram illustrating the sheet face sensing unit according to the present invention.

Referring to FIGS. 2 and 3, details of the sensor unit 40 will be described.

As shown in FIG. 2, the sensor unit 40 has a block 46 indicated by oblique lines. The block 46 is formed with a light projection path 46a extending obliquely downwardly from the right upper portion of the block 46, an opening 46b at the lower portion of the block 46, and a light receiving path 46c extending obliquely upwardly to the left upper portion of the block 46 from the opening 46b. A light emitting element 41 is attached to the right side upper face of the block 46 to emit light inwardly of the light projection path 46a. The light is incident upon the developer sheet 28 at an angle of 60 degrees and reflected thereon at the same angle. The reflected light advances along the light receiving path 46c.

An electronic substrate 45 is attached to the left side upper face of the block 46, on which the light receiving element 42 is mounted to receive the reflected light. An electric circuit of the sensor unit 40 is shown in FIG. 3. The circuit includes a constant current circuit 44 for supplying a constant current to the light emitting element 41. The constant current circuit 44 is made up of an operational amplifier 44a, a PNP transistor 44b and a resistor 44c. The non-inverting input terminal of the operational amplifier 44a is applied with a reference voltage $V_{ref}$ and the inverting input terminal thereof is connected to the emitter of the transistor 44b. The output terminal of the operational amplifier 44a is connected to the base of the transistor 44b. The emitter of the transistor 44b is grounded through the resistor 44c. The collector of the transistor 44b is connected through the light emitting element 41 to a d.c. power supply $V_{cc}$.

As will be described later, the reference voltage $V_{ref}$ is controlled by a central processing unit (CPU) 49 to be described later with reference to FIG. 4. The output current $I_O$ of the operational amplifier 44a is at constant whose level is determined by the reference voltage $V_{ref}$ and the resistance of the resistor 44c, i.e., $I_O = V_{ref}/R_{44c}$ where $R_{44c}$ is the resistance of the resistor 44c. With the constant current $I_O$ applied to the base of the transistor 44b, a constant current flows in the collector of the transistor 44b. Consequently, the light emitting element 41 emits light under a stable condition.

The light receiving element 42 disposed to receive the light reflected on the developer sheet 28 is connected across the non-inverting and inverting input terminals of a second operational amplifier 43. A parallel-connection of a resistor 43a and a capacitor 43b serving as an integration circuit is connected across the non-inverting input terminal and the output terminal of the second operational amplifier 43. A minute current flowing through the light receiving element 42 is integrated by the integration circuit, thereby providing a stable output. The output terminal of the second operational amplifier 43 is connected to the non-inverting input terminal of a third operational amplifier 47. A resistor 47a is connected across the output terminal and the inverting input terminal of the third operational amplifier 47. The inverting input terminal of the third operational amplifier 47 is connected through a resistor 47b to ground. An inversion amplifier is configured by the third operational amplifier 47 and its associated elements, wherein a small output current from the second operational amplifier 43 is amplified and an output signal $V_{OUT}$ is developed at the output terminal of the third operational amplifier 47. The output signal $V_{OUT}$ is applied through an input/output (I/0) port 48 to the CPU 49. The CPU 49 has a memory connected thereto in which stored are data regarding light emission amount vs. the reference voltage $V_{ref}$ and also light receiving amount vs. output signal $V_{out}$. Accordingly, a reflection ratio can be computed based on the reference voltage $V_{ref}$ and the output signal $V_{out}$. The CPU 49 determines whether the detected face of the developer sheet 28 is front or rear based on the reflection ratio thus computed and then outputs a sheet face indicative signal.

Figure 5:
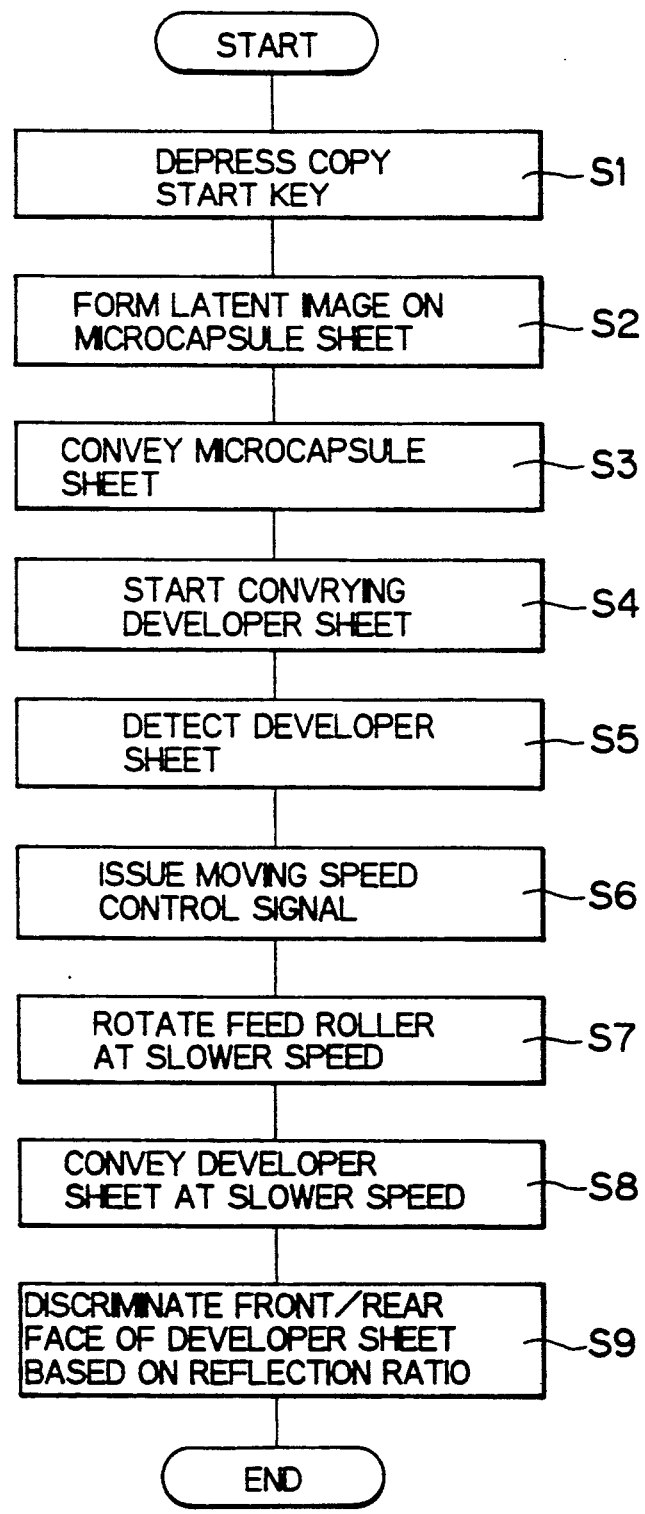
FIG. 5 is a flow chart for description of an operation of the image recording apparatus of the present invention.

Operation of the image recording apparatus 1 incorporating the sheet face sensor unit 40 will be described with reference to FIG. 5.

Upon depression of the copy start key (step S1), the microcapsule sheet 12 passes the exposure stand 11 where a latent image is formed on the microcapsule sheet 12 (step S2). The latent image formed microcapsule sheet 12 is further conveyed and in timed relation thereto the uppermost developer sheet 28 on the sheet cassette 29 is fed out (steps S3 and S4). When the developer sheet 28 passes beneath the sheet face sensor unit 40, the arrival of the developer sheet 28 is first sensed by the light emitting and light receiving elements 41 and 42 (step S5) and a moving speed control signal is issued from the CPU 49. The moving speed control signal is fed to a roller control unit 310 (see FIG. 4) which controls the feed rollers 31b to rotate it at a slower speed (step S7), with the result that the moving speed of the developer sheet 28 is slow down (step S8). The light from the light emitting element 41 is irradiated onto the slowly moving developer sheet 28 and the light reflected therefrom is received at the light receiving element 42. Since the sheet face detection is performed under the slow movement of the developer sheet 28, the light received at the light receiving element 42 correctly identifies the surface condition of the developer sheet 28. Consequently, the result of computation of the reflection ratio correctly indicates the sheet face of the developer sheet 28 (step S9). The sheet face indicative signal is outputted from the CPU 49 and only when the front face of the developer sheet 28 is detected, the subsequent operation is carried out.

While in the above description, the moving speed of the developer sheet 28 is slow down at the time of reflection ratio measurement, the conveyance of the developer sheet 28 may be temporarily stopped during the measurement.

As described, since the sheet face of the developer sheet 28 is optically detected, the face of the developer sheet 28 is not damaged. Further, the cost of the developer sheet is not increased which may otherwise be caused if a mark or an index is printed on one face of the developer sheet 28.

When the rear face of the developer sheet 28 is detected, the subsequent processing is performed in various ways to be described later on.

EXAMPLE 1

Figure 4:
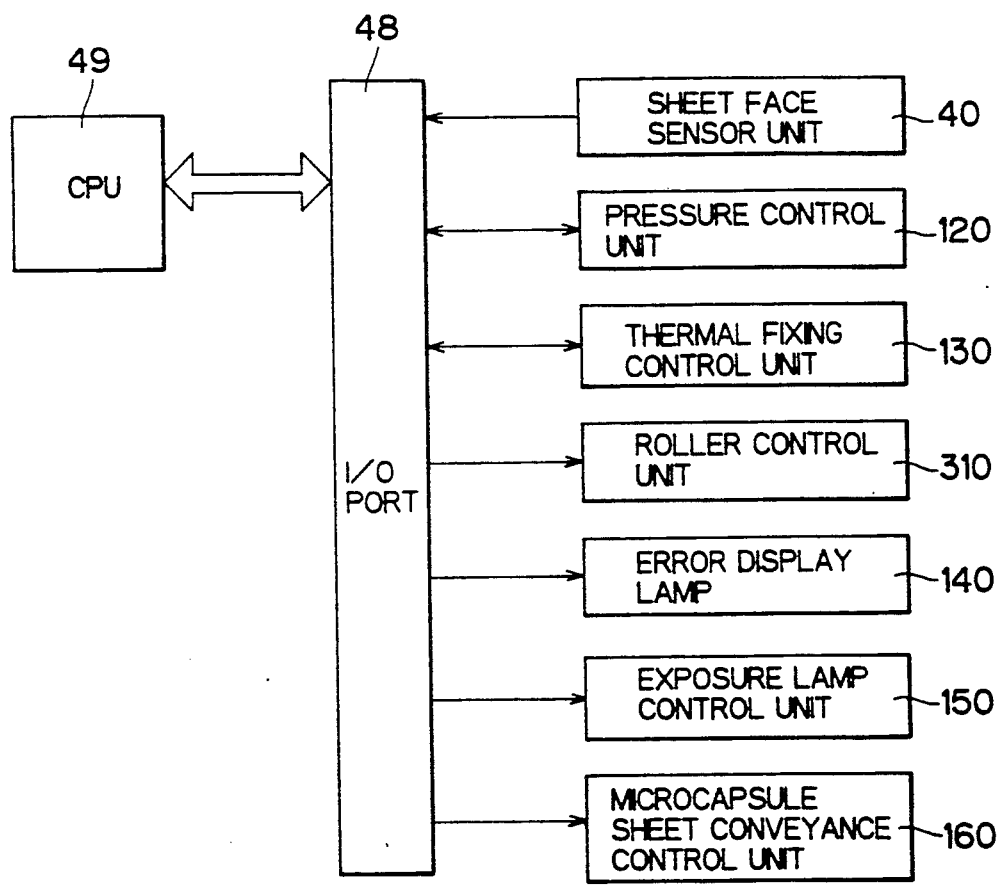
FIG. 4 is a block diagram showing an electrical arrangement incorporated in the image recording apparatus of the present invention.

Upon detection of the rear face of the developer sheet 28, the CPU 49 issues instructions to both a pressure control unit 120 and a thermal fixing control unit 130 connected through the I/0 port 48 to the CPU 49 as shown in FIG. 4. In response to the instruction, the pressure control unit 120 controls the pressure developing unit 22 so that the developer sheet 28 is allowed to pass therethrough without being nipped by the large diameter roller 22a and the backup roller 22b. Similarly, in response to the instruction fed from the CPU 49, the thermal fixing control unit 130 controls the thermal fixing unit 32 to move the heat rollers 32a, 32a and the sheet discharge rollers 32b, 32b away from the respective counterpart rollers, thereby allowing the developer sheet 28 to be discharged onto the discharge tray 33 without being touched to the roller surfaces. Even after the sheet face orientation error is detected, the conveyance of the latent image formed microcapsule sheet 12 is continued and wound around the takeup shaft 24 without being processed in the pressure developing unit 22.

In this manner, when it is detected that the developer sheet 28 is fed in an orientation upside down, the developer sheet 28 is discharged with no processing in the pressure developing unit 22 and the thermal fixing unit 32. Therefore, the rollers are prevented from being smeared and the discharged developer sheet can be again used. Further, the image forming process is not interrupted even if there is a sheet face orientation error.

EXAMPLE 2

In the case where the sheet face orientation error occurs in the midst of the copying operation and if as in Example 1 the microcapsule sheet 12 is moved together with the developer sheet and wound around the takeup shaft 24, a certain length of the microcapsule sheet 12 is left unused. To avoid the waste of the microcapsule sheet 12, the processing of the microcapsule sheet 12 is performed to be described below.

As shown in FIG. 4, an exposure lamp control unit 150 and microcapsule sheet conveyance control unit 160 are connected through the I/0 port 48 to the CPU 49. The exposure lamp control unit 150 controls the halogen lamp or the exposure lamp 5a, and the microcapsule sheet conveyance control unit 160 controls the conveyance of the microcapsule sheet 12.

When the sheet face orientation error is detected, the the CPU 49 produces an instruction to the exposure lamp control unit 150 to turn off the exposure lamp 5a. Concurrently, the CPU 49 issues an instruction to the microcapsule sheet conveyance control unit 160 to further convey the microcapsule sheet 12 a predetermined distance. This further conveyance of the microcapsule sheet 12 is to convey the microcapsule sheet 12 together with the developer sheet 28 so that the developer sheet 28 can be removed at an appropriate position. The microcapsule sheet 12 is then backwardly moved to the original position where the exposure lamp is turned off and the subsequent copying operation is started from this condition.

Figure 6:
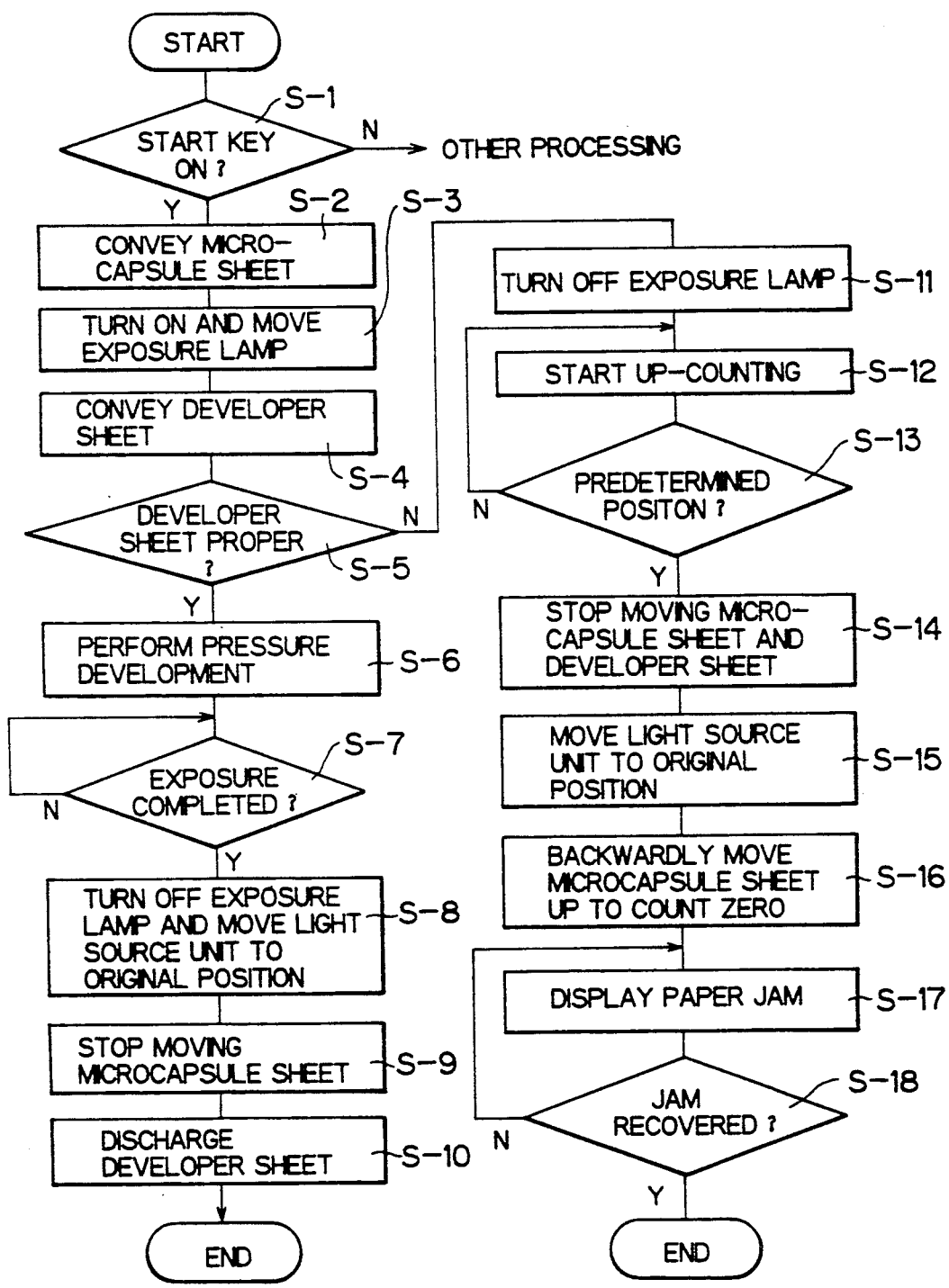
FIG. 6 is a flow chart for description of an operation according to one embodiment of the present invention.

Operation of the image recording apparatus will be describe far more in detail with reference to the flow chart illustrated in FIG. 6.

Upon depression of the start key (step S1), the conveyance of the microcapsule sheet 12 is started (step S2). Then, the exposure lamp 5a is turned on and the reflection mirror 8, the exposure lamp 5a and the reflection mirrors 9a, 9b move as described previously (step S3). In synchronism with the movement of the microcapsule sheet 12, the developer sheet 28 is fed out from the sheet cassette 29 (step S4). The developer sheet 28 passes past the sheet face sensor unit 40 before the sheet 28 is introduced into the pressure developing unit 22 to discriminate the sheet face of the developer sheet 28 (step S5). If detection is made so that the sheet face orientation is proper (yes in step S5), the microcapsule sheet 12 and the developer sheet 28 are brought into facial contact with each other and introduced into the pressure developing unit 22 to perform pressure development (step S6). When it is confirmed that the exposure has been completed (yes in step S7), the exposure lamp 5a is turned off and the light source unit 5 is moved back to the original position (step S8). At the same time, the conveyance of the microcapsule sheet 12 is stopped (step S9). On the other hand, the developer sheet 28 carrying the copied image thereon passes through the thermal fixing unit 32 and thereafter discharged onto the discharge tray 33 (step S10).

When decision is made in step S5 so that there is a sheet face orientation error, the sheet face sensor unit 40 outputs a signal to the CPU 49. Upon receipt of this signal, the CPU 49 sends instructions to both the exposure lamp control unit 150 and the microcapsule sheet conveyance control unit 160. In response to the instructions, the exposure lamp 5a is turned off (step S11). At the same time, a counter (not shown) starts up-counting to measure an amount of conveyance of the microcapsule sheet 12 from the time at which the exposure lamp 5a is turned off (step S12). Both the microcapsule sheet 12 and the developer sheet 28 are conveyed together to a predetermined position where the operator can easily remove the developer sheet 12 (step S13). When conveyance of the microcapsule sheet 12 and the developer sheet 28 is stopped (step S14), the counter stops counting.

Thereafter, the light source unit 5 is returned to the original position (step S15) and the microcapsule sheet 12 is backwardly moved. In accordance with the backward movement of the microcapsule sheet 12, the counter performs down-counting and the backward movement thereof is stopped when the counter is zeroed (step S16). That is, the microcapsule sheet 12 is returned to the position when the exposure lamp 5a is turned off at step S1. The microcapsule sheet 12 is now so positioned that the subsequent copying operation can be restarted if the removal of the developer sheet 28 has been attended to by the operator who noted the paper jam from the indication of the display (steps S17 and S18).

EXAMPLE 3

To more effectively use the microcapsule sheet 12, the exposure operation onto the microcapsule sheet 12 is continued until the whole latent image is formed thereon even after the occurrence of the sheet face orientation error. Upon completion of the exposure, the microcapsule sheet 12 is backwardly moved to the initial position past the exposure stand 11 by the control of the microcapsule sheet conveyance control unit 160. At this time, the exposure lamp 5a is being turned off by the control of the exposure lamp control unit 150. The improperly fed developer sheet 28 is backwardly moved and discharged out of the sheet feed guide and another developer sheet 28 is fed out from the sheet cassette 19. If the sheet face of the new developer sheet 28 is properly orientated, the image is developed thereon with the use of the previously exposed microcapsule 12.

The improper developer sheet 28 may not necessarily be backwardly moved and discharged out of the sheet feed guide but the presence of such sheet may be displayed on the panel so that the operator can remove it. In any event, the improperly fed developer sheet 28 does not pass through the pressure developing unit 22 and the thermal fixing unit 32, whereby occurrences of paper jamming and the machine trouble can be prevented.

Figure 7:
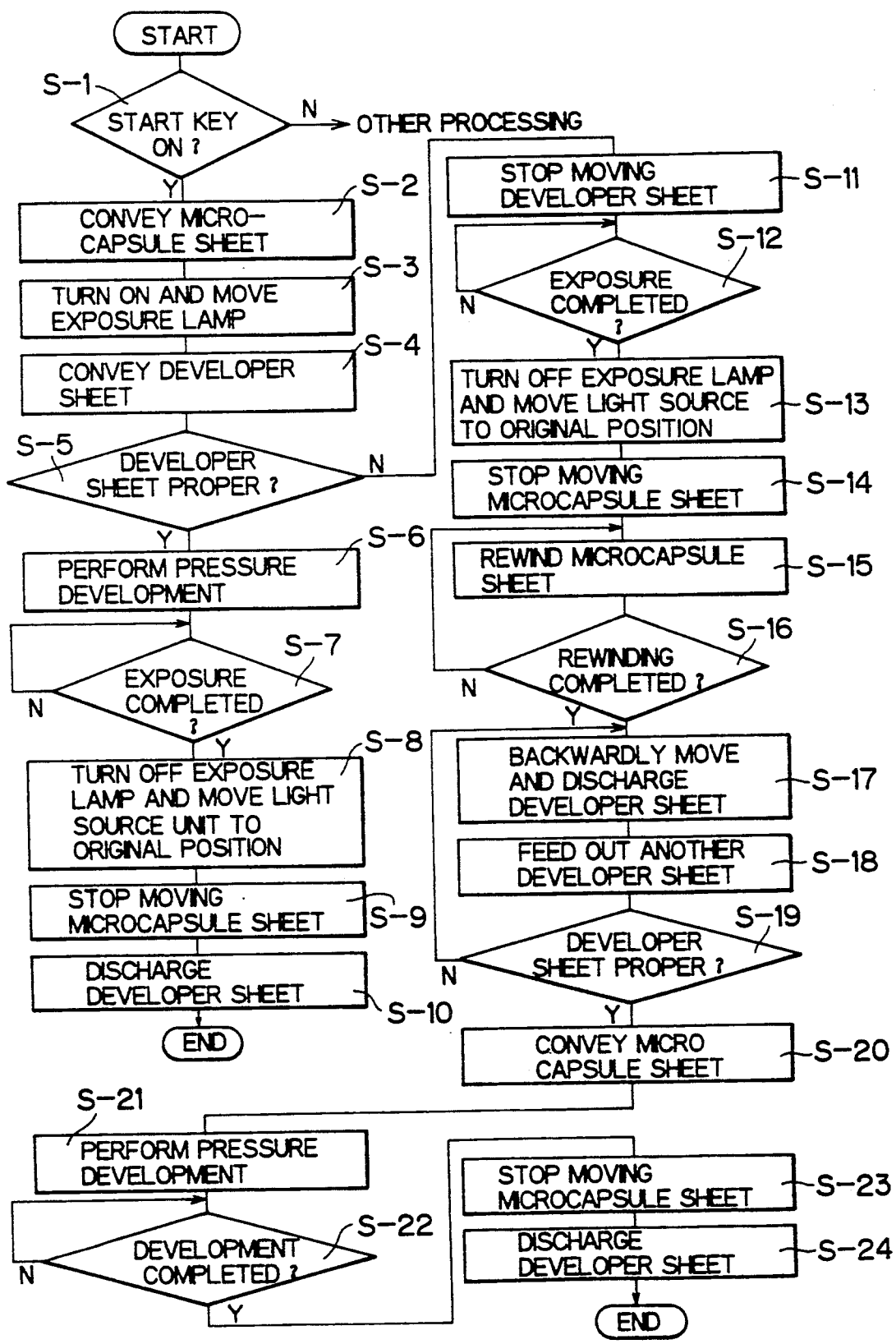
FIG. 7 is a flow chart for description of an operation according to another embodiment of the present invention.

Operation of the apparatus will be described in detail with reference to the flow chart illustrated in FIG. 7. In the flow chart of FIG. 7, the processings executed in steps S1 through S10 are exactly the same as those in the corresponding steps in the flow chart of FIG. 6. Therefore, duplicate operation thereof is omitted.

When decision made in step S5 indicates the occurrence of the sheet face orientation error, the CPU 46 sends instructions to both the exposure lamp control unit 150 and the microcapsule sheet conveyance control unit 160. The conveyance of the developer sheet 28 is stopped (step S11) and then decision is made as to whether or not the exposure onto the microcapsule sheet 12 has been completed (step S12). If yes, the exposure lamp 5a is turned off and moved back to the original position (step S13) and further conveyance of the microcapsule sheet 12 is not performed (step S14). The latent image formed microcapsule sheet 12 is moved backwardly past the exposure stand 11 in accordance with the rewinding operation of the carriage shaft 14 and placed to the initial state (step S15). Upon confirming that the rewinding of the microcapsule sheet 12 has been completed (step S16), the developer sheet 28 is moved backwardly and fed out of the sheet feed guide (step S17).

Another developer sheet 28 is fed out from the sheet cassette 29 and moved toward the pressure developing unit 22 (step S18). Before the developer sheet 28 is introduced into the pressure developing unit 22, the sheet face orientation is discriminated with the sheet face sensor 49 (step S19). If the sheet feed orientation is proper, the microcapsule sheet 12 is again conveyed forwardly in timed relation to the conveyance of the developer sheet 28 (step S20) and the pressure development is performed in the pressure developing unit 22 (step S21). Upon confirming that the pressure development has been completed (step S22), the conveyance of the microcapsule sheet 12 is stopped (step S23). The image formed developer sheet 28, on the other hand, is further conveyed and discharged onto the discharge tray 33 (step S24).

EXAMPLE 4

There may be a case where the sheet face orientation error is detected during successive production of copies. If in such a case the operation of the apparatus is immediately halted, the apparatus indicates that the developer sheets staying within the apparatus are jammed and those sheet are removed as unavailable incomplete copies. To effectively use such sheets, when the rear face of the developer sheet 28 is detected, drivings of the feed rollers 31a, 31b, 31c are immediately halted. In the absence of other developer sheet 28 within the apparatus, an error display lamp 140 on the panel is lit to thereby alerting the operator of the error in the sheet face orientation. If a continuous or successive copying operation is being performed and several developer sheets 28 are being successively processed, the remaining processes for such developer sheets, which may be in the pressure development and/or the thermal fixing, are completed rather than immediately lighting the error display lamp 140. This operation is performed when at least one of the pressure control unit and the thermal fixing control unit is in operation. The error display lamp 140 is not lit until the developer sheet 28 has passed through the sheet discharge roller 32b.

As described, the error display is not performed until the developer sheets remaining within the apparatus are completely discharged out of the apparatus.

EXAMPLE 5

If the developer sheets are erroneously set in the sheet cassette 29 upside down, all the developer sheets to be fed out therefrom are improper. On the other hand, if the developer sheet is fed one by one in manual insertion mode, some may be improperly fed. The former case is particularly troublesome in that a great deal of processings must be performed. In this Example, when the improperly fed developer sheets are successively detected, the processing of the developer sheet is made different from that performed when the improperly fed developer sheets are not detected so frequently.

Figure 8:
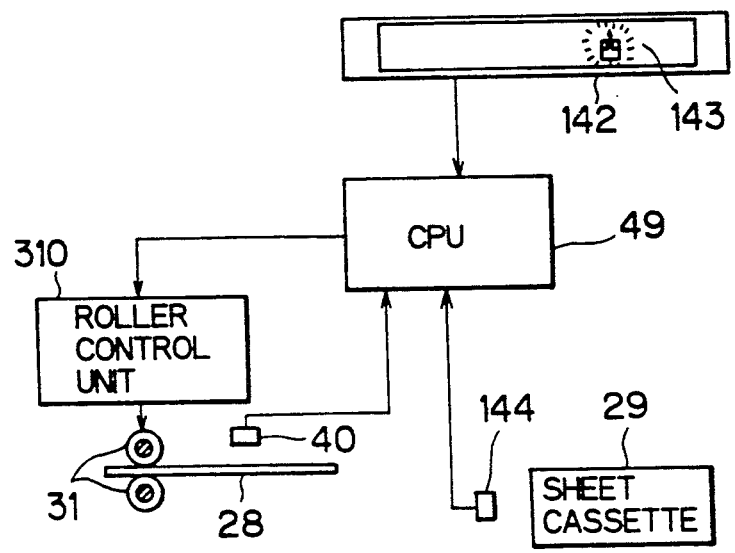
FIG. 8 is a block diagram illustrating still another embodiment of the present invention.

FIG. 8 shows an arrangement of a control unit which includes a CPU 49 to which the sheet face sensor unit 40 is connected through an I/0 port (not shown in FIG. 8) and a roller control unit 310 which controls the developer sheet feed rollers 31a, 31b, 31c. When the sheet face orientation error is detected, the processing of the improperly fed sheet is performed by moving it forwardly or backwardly or by stopping the movement of the sheet at certain position owing to the control of the roller control unit 310.

When two or more than two developer sheets are successively detected as being improper, different processing is carried out. For example, the display 142 on the control panel is controlled so that a mark 143 of the sheet cassette 29 displayed thereon flickers, which mark is continuously lit if the sheet cassette 29 is empty with the developer sheets 28. Flickering of the mark 143 will notify the operator of the erroneous setting of the developer sheets on the sheet cassette 29.

A sheet face error mark having dual display modes may be displayed independently of the sheet cassette mark 143. Specifically, when the firstly fed developer sheet is detected as being improper, the error mark is displayed in one mode and the subsequent developer sheets are also detected as being improper, the error mark is displaced in different mode.

Adjacent the sheet cassette 29, there is provided a sensor 144 which senses if the sheet cassette 29 is loaded in the apparatus 1. The sensor 144 output a sensing signal to the CPU 49. When plural developer sheets are successively improperly fed, the CPU 49 instructs the roller control unit 310 not to move the developer sheet 28. Such occurrence results most probably from the wrong placement of the developer sheets in the sheete cassette. The successive copying operation cannot be resumed until the sensor 144 indicates that the sheet cassette 29 is once unloaded.

Figure 9:
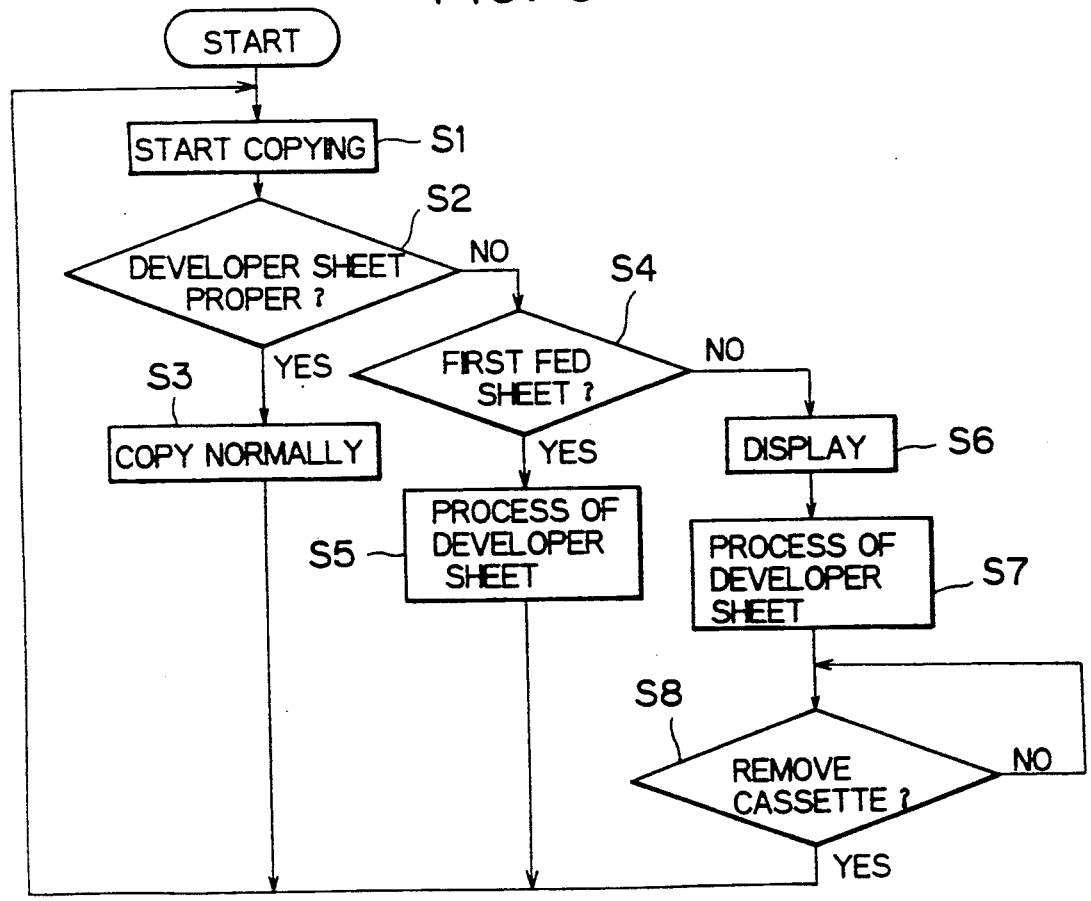
FIG. 9 is a flow chart for description of an operation according to the embodiment shown in FIG. 8.

Operation will be described while referring to the flow chart of FIG. 9.

Upon start of the copying operation (step S1), decision is made as to whether or not the face of the developer sheet is correctly oriented (step S2). If affirmative, the copying operation is normally performed (step S3). If negative, decision is made as to whether the sheet in question is the firstly fed one or not (step S4). If yes, the processing of the improperly fed developer sheet is performed (step S5), whereupon the routine returns to step S1. If, on the other hand, successively fed sheets are detected to be entirely improper, such occurrence is displayed (step S6) and processing of such developer sheets are carried out (step S7). Thereafter, it is checked whether the sheet cassette 29 is unloaded (step S8). If yes, the routine returns to step S1 and the copying operation is enabled.

EXAMPLE 6

Figure 10:
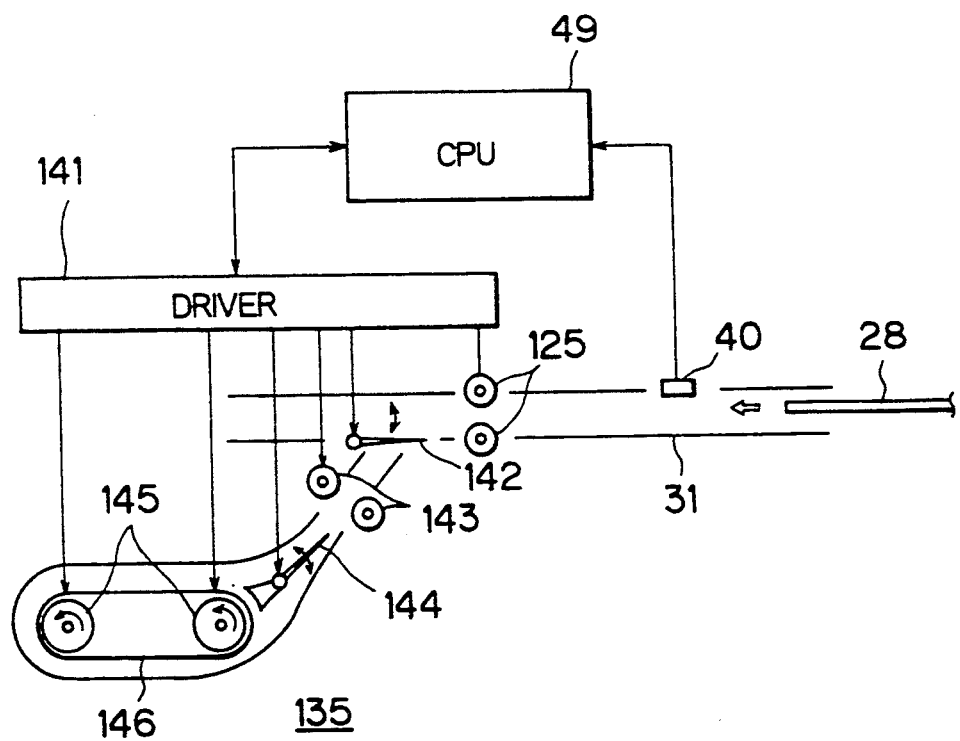
FIG. 10 is a explanatory diagram showing yet another embodiment of the present invention.

FIG. 10 shows another example in which when the sheet face orientation error is detected, the developer sheet is automatically reversed. To this end, there is provided a sheet reversing device 135 disposed upstream of the pressure developing unit 22. When the error is detected by the CPU 49, an instruction is sent to a driver 141 which in turn activate the sheet reversing device 135.

The sheet reversing device 135 includes a movable guide 142 which guides the developer sheet into an auxiliary sheet guide path branched from the sheet guide path 31, a feed rollers 143, a movable guide 144 for changing the sheet advancing direction, and a conveyor belt 146 stretched between the spaced apart belt rollers 145. The feed rollers 143 and the belt rollers 145 are controlled by the driver 141.

In operation, when the developer sheet 28 is properly fed, the movable guide 142 is in the position shown in FIG. 10 and the developer sheet 28 is conveyed through the sheet guide path 31. On the other hand, if the developer sheet is improperly fed, the movable guide 142 is upwardly moved to thereby change the direction in which the developer sheet advances. The developer sheet 28 is therefore introduced into the sheet reversing device 135. The movable guide 144 is initially positioned downwardly and the belt rollers 145 rotate in the direction indicated by arrows. The developer sheet 28 is fed by the belt 146 while being attracted thereto. Upon reversal of the developer sheet and its leading edge approaches the movable guide 144, the movable guide 144 is upwardly pivotally moved. It is assumed that when the leading edge of the developer sheet has reached the movable guide 144, the trailing edge thereof has been passed past the movable guide 144. Then, the feed roller 143 is reversely rotated to thereby return the developer sheet 28 to the sheet guide path 31. At this time, the feed rollers 125 are reversely rotated to pull the leading edge of the developer sheet backwardly until the trailing edge thereof is completely brought in the guide path 31. Thereafter, the rollers 125 are forwardly rotated to feed the developer sheet. In this manner, the improperly fed developer sheet is reversed by the device 135.

What is claimed is:

1. An image recording apparatus for recording an image of an original document on an image receiving sheet with the use of a photosensitive recording medium, the image receiving sheet having front and rear faces differing in reflection ratio, the apparatus comprising:

exposure means for exposing a photosensitive recording medium with an imaging light to form a latent image hereon;

first conveying means for conveying the photosensitive recording medium;

second conveying means for conveying the image receiving sheet normally at a given speed;

developing means for developing the latent image and forming a visible image on the image receiving sheet;

thermal fixing means for thermally fixing the visible image formed on the image receiving sheet;

discrimination means disposed upstream of said developing means with respect to a direction in which the image receiving sheet is conveyed, for discriminating a face of the image receiving sheet, said discrimination means including a light emitting element for emitting light toward the face of the image receiving sheet and a light receiving element for receiving light emitted from said light emitting element and reflected on he face of the image receiving sheet;

control means supplied with data representative of amounts of light emitted from said light emitting element and light received at said light receiving element, wherein said control unit computes a reflection ratio based on the data supplied thereto and produces a discrimination signal indicative of an error in sheet face orientation of the image receiving sheet based on the reflection ratio being computed;

said control unit controls said second conveying means so that the image receiving sheet is either temporarily stopped or conveyed at a speed lower than the given speed when said light receiving element receives the light reflected on the face of the image receiving sheet; and wherein responsive to the discrimination signal, said control means further controls both said developing means and said thermal fixing means so that the image receiving sheet is not processed thereby; and wherein said second conveying means conveys the image receiving sheet through said developing means and said thermal fixing means when the discrimination signal is produced.

2. The image recording apparatus according to claim 1, further comprising alerting means responsive to the discrimination signal for alerting occurrence of the error in the sheet face orientation.

3. The image recording apparatus according to claim 1, wherein said developing means includes a pair of rollers having a nip therebetween for normally applying a pressure to the image receiving sheet and the photosensitive recording medium supoerposed one on the other, said pair of rollers being moved away from each other so as not to apply pressure to the superposed image receiving sheet and the photosensitive recording medium when said control means outputs the discrimination signal, and wherein said thermal fixing means includes at least a pair of rollers for feeding the image receiving sheet, said pair of rollers of said thermal fixing means being moved away from each other so that the image receiving sheet does not contact said pair of rollers of said thermal fixing means.

4. The image recording apparatus according to claim 1, wherein said second conveying means conveys the image receiving sheet to a predetermined position where the image receiving sheet can be removed when the discrimination signal is produced.

5. The image recording apparatus according to claim 4, wherein when the discrimination signal is produced, said control means controls said exposure means to stop performing exposure and also controls said first conveying means to convey the photosensitive recording medium a predetermined distance together with the conveyance of the image receiving sheet to reach the predetermined position and then to backwardly convey the photosensitive recording medium an equal predetermined distance.

6. The image recording apparatus according to claim 1, wherein said first conveying means conveys the photosensitive recording medium together with the conveyance of the image receiving sheet by said second conveying means when the discrimination signal is produced.

7. The image recording apparatus according to claim 1, further comprising alerting means for alerting occurrence of the error in the sheet face orientation, and wherein responsive to the discrimination signal, said control means controls said second conveying means to prohibit supply of new image receiving sheets and further controls said alerting means to alert occurrence of the error in the sheet face orientation after processing of the image receiving sheets is completed.

8. An image recording apparatus for recording an image of an original document on an image receiving sheet with the use of a photosensitive recording medium, the image receiving sheet having front and rear faces differing in reflection ratio, the apparatus comprising:

exposure means for exposing a photosensitive recording medium with an imaging light to form a latent image thereon;

first conveying means for conveying the photosensitive recording medium;

second conveying means for conveying the image receiving sheet normally at a given speed;

developing means for developing the latent image and forming a visible image on the image receiving sheet;

thermal fixing means for thermally fixing the visible image formed on the image receiving sheet;

discrimination means disposed upstream of said developing means with respect to a direction in which the image receiving sheet is conveyed, for discriminating a face of the image receiving sheet, said discrimination means including a light emitting element for emitting light toward the face of the image receiving sheet and a light receiving element for receiving light emitted from said light emitting element and reflected on the face of the image receiving sheet; and control means supplied with data representative of amounts of light emitted from said light emitting element and light received at said light receiving element, wherein said control unit computes a reflection ratio based on the data supplied thereto and produces a discrimination signal indicative of an error in sheet face orientation of the image receiving sheet based on the reflection ratio being computed, and wherein said control unit controls said second conveying means so that the image receiving sheet is either temporarily stopped or conveyed at a speed lower than the given speed when said light receiving element receive the light reflected on the face of the image receiving sheet, wherein when the discrimination signal is produced, said control means controls said exposure means to continuously perform exposure and also controls said first conveying means to backwardly convey the photosensitive recording medium a predetermined distance upon completion of the exposure, and said control means further controls said second conveying means to discharge the image receiving sheet and thereafter feed out another image receiving sheet, the another image receiving sheet and the already exposed photosensitive recording medium being used in combination to perform image recordation if the another image receiving sheet does not cause an error in sheet face orientation.

9. The image recording apparatus according to claim 8, wherein the image receiving sheet is discharged without passing through said developing means and said thermal fixing means.

10. An image recording apparatus for recording an image of an original document on an image receiving sheet with the use of a photosensitive recording medium, the image receiving sheet having front and rear faces differing in reflection ratio, the apparatus comprising:

exposure means for exposing a photosensitive recording medium with an imaging light to form a latent image thereon;

first conveying means for conveying the photosensitive recording medium;

second conveying means for conveying the image receiving sheet normally at a given speed;

developing means for developing the latent image and forming a visible image on the image receiving sheet;

thermal fixing means for thermally fixing the visible image formed on the image receiving sheet;

discrimination means disposed upstream of said developing means with respect to a direction in which the image receiving sheet is conveyed, for discriminating a face of the image receiving sheet, said discrimination means including a light emitting element for emitting light toward the face of the image receiving sheet and a light receiving element for receiving light emitted from said light emitting element and reflected on he face of the image receiving sheet; and control means supplied with data representative of amounts of light emitted from said light emitting element and light received at said light receiving element, wherein said control unit computes a reflection ratio based on the data supplied thereto and produces a discrimination signal indicative of an error in sheet face orientation of the image receiving sheet based on the reflection ratio being computed, wherein said control unit controls said second conveying means so that the image receiving sheet is either temporarily stopped or conveyed at a speed lower than the given speed when said light receiving element receives the light reflected on the face of the image receiving sheet, and wherein when the discrimination signal is produced, said control means controls said first conveying means to backwardly convey the photosensitive recording medium a predetermined distance.

* * * * *